(12) United States Patent
Kwak et al.

(10) Patent No.: US 7,586,254 B2
(45) Date of Patent: Sep. 8, 2009

(54) ORGANIC ELECTROLUMINESCENCE DISPLAY DEVICE

(75) Inventors: Won-Kyu Kwak, Suwon-si (KR); Kwan-Hee Lee, Suwon-si (KR); Sung-Cheon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 691 days.

(21) Appl. No.: 11/132,349

(22) Filed: May 19, 2005

(65) Prior Publication Data

US 2005/0258744 A1 Nov. 24, 2005

(30) Foreign Application Priority Data

May 22, 2004 (KR) .............. 10-2004-0036636

(51) Int. Cl.
*H05B 33/00* (2006.01)
(52) U.S. Cl. .............. 313/504; 313/506; 313/113; 257/88
(58) Field of Classification Search .............. 313/504, 313/506, 112
See application file for complete search history.

(56) References Cited

U.S. PATENT DOCUMENTS

| | | | |
|---|---|---|---|
| 6,787,994 B2 * | 9/2004 | Cok | 313/512 |
| 7,199,520 B2 * | 4/2007 | Fujii et al. | 313/506 |
| 2004/0195965 A1 * | 10/2004 | Yamazaki et al. | 313/506 |
| 2004/0263064 A1 * | 12/2004 | Huang | 313/504 |
| 2004/0263066 A1 * | 12/2004 | Abe et al. | 313/504 |

FOREIGN PATENT DOCUMENTS

| | | |
|---|---|---|
| CN | 1624735 | 6/2005 |
| CN | 1765156 | 4/2006 |
| JP | 2001-067049 | 3/2001 |
| JP | 2003-345271 | 12/2003 |
| JP | 2004-086014 | 3/2004 |
| KR | 10-2003-0020034 A | 3/2003 |
| KR | 2003-0019015 | 3/2003 |
| KR | 10-2003-0091332 A | 12/2003 |
| WO | 2004026001 | 3/2004 |

OTHER PUBLICATIONS

Chinese Office Action dated Jun. 27, 2008.

* cited by examiner

*Primary Examiner*—Ashok Patel
(74) *Attorney, Agent, or Firm*—H.C. Park & Associates, PLC

(57) ABSTRACT

An organic electroluminescence (EL) display device having a portion emitting light toward a side of a substrate and a portion emitting light toward another side of the substrate. The organic EL display device includes a substrate, a first organic light emitting unit formed on the substrate, and a second organic light emitting unit formed on the substrate and adjacent to the first organic light emitting unit. The first organic light emitting unit and the second organic light emitting unit emit light in different directions.

19 Claims, 7 Drawing Sheets

ORGANIC ELECTROLUMINESCENCE DISPLAY DEVICE

CROSS REFERENCE TO RELATED APPLICATION

This application claims priority to and the benefit of Korean Patent Application No. 10-2004-0036636, filed on May 22, 2004, which is hereby incorporated by reference for all purposes as if fully set forth herein.

BACKGROUND OF THE INVENTION

1. Field of the Invention

The present invention relates to an organic electroluminescence (EL) display device having a region emitting light toward a substrate and a region emitting light away from the substrate, and more particularly, to an organic EL display device having a first organic light emitting unit that emits light away from the substrate and a second organic light emitting unit that emits light toward the substrate.

2. Discussion of the Background

Generally, an organic EL display device is a self-emitting device that electrically excites a fluorescent organic compound to emit light. It is considered a next generation display device because it may be driven with a low voltage, it is thin, and it has a wide viewing angle and rapid response speed. In the organic EL display device, an organic layer may be formed on a transparent insulating substrate, such as glass, and between electrode layers. With such a structure, when applying positive and negative voltages to the electrode layers, respectively, holes and electrons travel to the light emitting layer. Holes, which may be transported though a hole transport layer, may be injected from the electrode to which the positive voltage is applied. Electrons may be transported through an electron transport layer to the light emitting layer from the electrode to which the negative voltage is applied. The electrons and holes combine to generate exitons in the light emitting layer, and when the exitons transition from an exited state to a ground state, fluorescent particles on the light emitting layer emit light, thereby displaying images.

An active matrix (AM) type organic EL display device includes at least two thin film transistors (TFTs) per pixel. One TFT may be used as a switching device that controls the pixel's operation, and the other as a driving device driving the pixel. The TFTs may include a semiconductor active layer having a channel region between a drain region and a source region, a gate insulating layer formed on the semiconductor active layer, a gate electrode formed on the gate insulating layer and above the channel region, and a drain electrode and a source electrode coupled to the drain region and the source region, respectively, through contact holes in an interlayer formed on the gate electrode.

Figure 1:
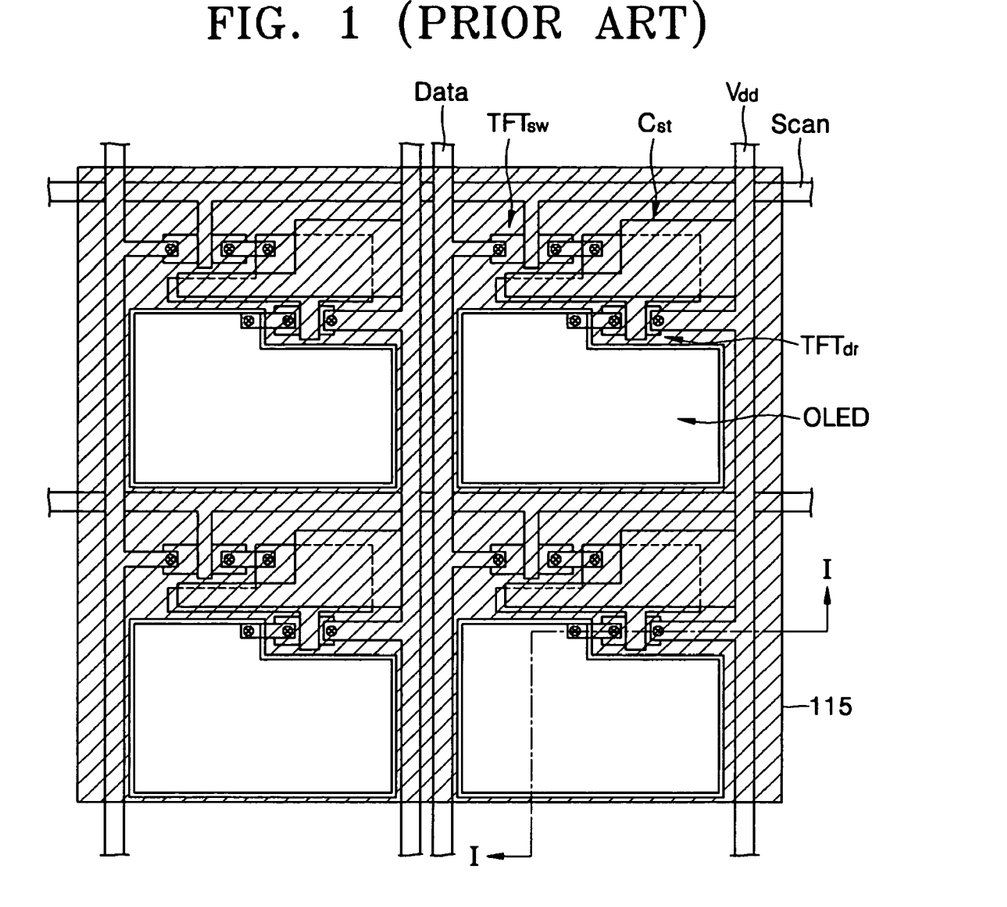
FIG. 1 is a plan view showing a pixel of a conventional organic EL display device.
Figure 2:
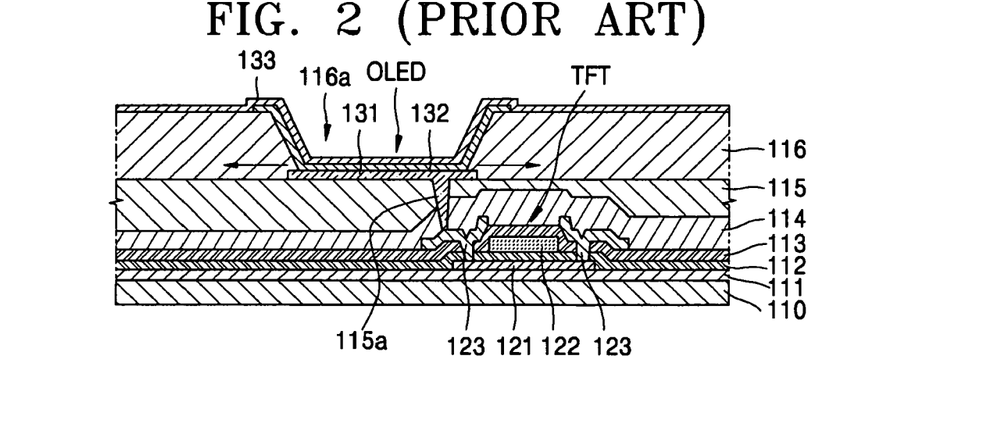
FIG. 2 is a cross-sectional view along line I-I of the organic EL display device of FIG. 1.

FIG. 1 is a plan view showing a pixel of a conventional organic EL display device, and FIG. 2 is a cross-sectional view showing the pixel of FIG. 1 along line I-I.

As FIG. 1 shows, the organic EL display device may include a plurality of pixels. A pixel may be surrounded by two adjacent scan lines Scan, two adjacent data lines Data, and a power line Vdd. Each pixel may include a switching TFT $TFT_{sw}$, a driving TFT $TFT_{dr}$, a capacitor $C_{st}$, and an organic EL device OLED. A pixel may include more than two TFTs and more than one capacitor.

The switching TFT $TFT_{sw}$ is driven by a scanning signal from the scan line Scan, and it transmits a data signal from the data line Data. The driving TFT $TFT_{dr}$ determines an amount of current flowing into the OLED through the driving line Vdd by the data signal from the switching TFT $TFT_{sw}$, that is, a voltage difference Vgs between the driving TFT's gate and source electrodes. The capacitor $C_{st}$ stores the data signal for one frame.

Referring to FIG. 2, which is a cross-sectional view along line I-I of FIG. 1, a buffer layer 111 is formed on a glass substrate 110, and the TFT and the OLED are formed on the buffer layer 111.

The AM type organic EL display device may be fabricated as follows.

A semiconductor active layer 121 is disposed on the buffer layer 111. A $SiO_2$ gate insulating layer 112 is disposed on the semiconductor active layer 121, and a gate electrode 122 is formed on a predetermined portion of the gate insulating layer 112 as a conductive layer of MoW or Al/Cu. The gate electrode 122 is connected to a gate line (not shown) for applying on/off signals. An interlayer dielectric 113 is formed on the gate electrode 122, and source/drain electrodes 123 are coupled to the source region and the drain region of the semiconductor active layer 121, respectively, through a contact hole. The power line Vdd may be formed when forming the source/drain electrodes 123. An $SiO_2$ or SiNx passivation layer 114 is formed on the source/drain electrodes 123, and an overcoat layer 115, which may be formed of an organic material such as acryl, poly-imide, or BCB, is formed on the passivation layer 114.

A via hole 115a exposing a source or drain electrode 123 is formed in the passivation layer 114 and the over coat layer 115 through a photolithography or perforation process. Additionally, a first electrode layer 131, as an anode, is formed on the over coat layer 115, and is coupled to the source or drain electrode 123 exposed by the via hole 115a. An organic pixel defining layer 116 is formed on the first electrode layer 131, and an organic layer 132 is formed in a region defined by an opening portion 116a of the pixel defining layer 116. The organic layer 132 includes the light emitting layer. A second electrode layer 133, as a cathode electrode, is formed to cover the organic layer 132. The organic layer 132 emits light by receiving holes and electrons from the first electrode layer 131 and the second electrode layer 133.

When the first electrode layer 131 is transparent and the second electrode layer 133 is reflective, light emitted from the organic layer 132 proceeds toward the substrate 110. This type of organic EL display device is referred to as a back surface emitting type. On the contrary, when the first electrode layer 131 is reflective and the second electrode layer 133 is transparent, light emitted from the organic layer 132 proceeds away from the substrate 110. This type of organic EL display device is referred to as a front surface emitting type.

However, in order to fabricate an organic EL display device that emits light in both directions, two organic EL display devices may be stacked upon on another.

Figure 3:
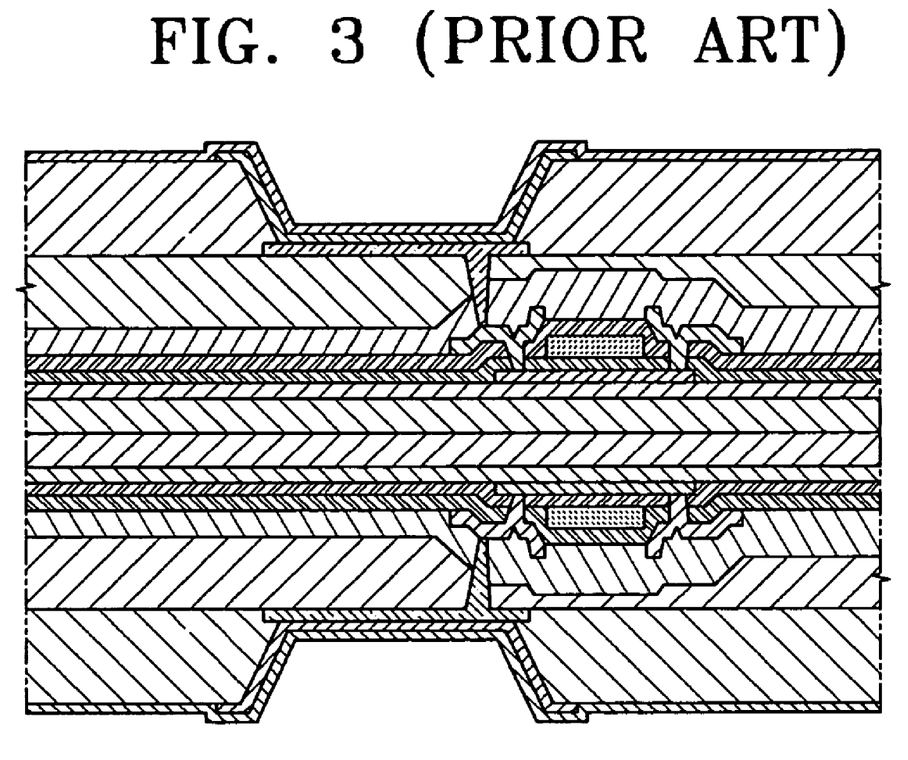
FIG. 3 is a cross-sectional view showing a conventional organic EL display device in which substrates are facing each other.

For example, as FIG. 3 shows, substrates of front surface emitting type devices may be combined to fabricate an organic EL display device that emits light in two directions. Alternatively, second electrode layers 133 of back surface emitting type devices may be disposed to face each other to fabricate the organic EL display device that emits light in two directions.

Korean Patent Publication No. 2003-0019015 discloses a folder type mobile communication terminal using an organic EL display device. This organic EL device, formed by stacking two EL devices, displays an image of a back surface when folded and displays an image of a front surface when unfolded.

However, since the above organic EL display device comprises two, stacked organic EL display devices, the device's thickness and cost increase correspondingly, and an additional driving device is required. Moreover, since the two organic EL devices overlap, it may not be easy to install a getter for protecting the organic layer 132.

SUMMARY OF THE INVENTION

The present invention provides an organic EL display device including an OLED emitting light toward a substrate and an OLED emitting light away from the substrate, and both OLEDs are formed on the same substrate.

The present invention also provides an organic EL display device with a first display unit and a second display unit emitting light in different directions, and TFTs of the first and second display units are fabricated on the same layer.

The present invention also provides an organic EL display device with a first display unit and a second display unit emitting light in different directions, and the first and second display units are driven by a single driving device.

The present invention also provides an organic EL display device on which a getter may be easily installed.

Additional features of the invention will be set forth in the description which follows, and in part will be apparent from the description, or may be learned by practice of the invention.

The present invention discloses an organic EL display device including a substrate, and a first organic light emitting unit and a second organic light emitting unit formed on the substrate. The first organic light emitting unit and the second organic light emitting unit emit light in different directions.

The present invention also discloses an organic EL display device comprising a first organic light emitting unit and a second organic light emitting unit formed on a same substrate. The first organic light emitting unit displays a first image in a first direction away from the substrate, and the second organic light emitting unit displays a second image in a second direction towards the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 4:
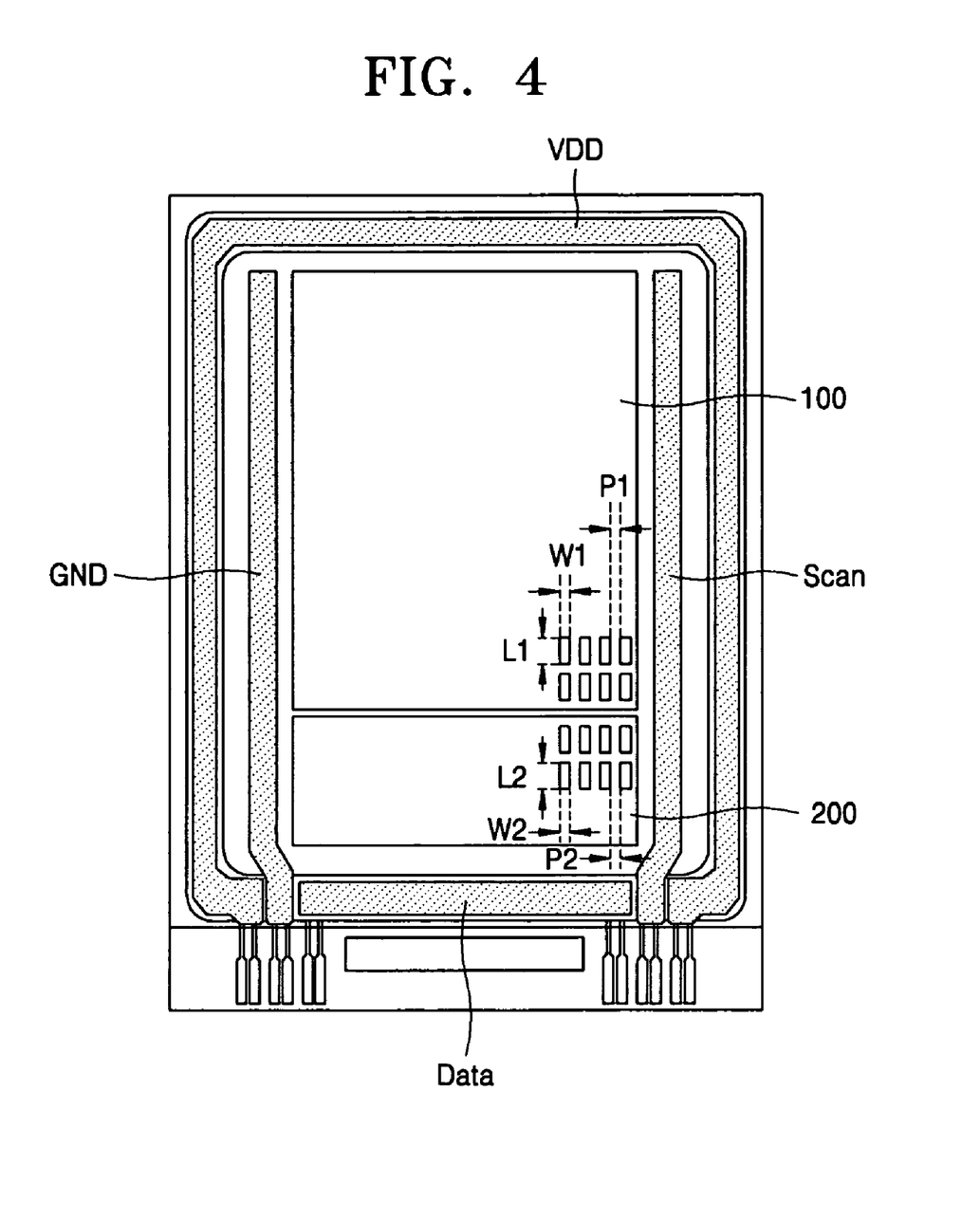
FIG. 4 is a schematic plan view showing an organic EL display device according to an exemplary embodiment of the present invention.

FIG. 4 is a schematic plan view showing an organic EL display device according to an exemplary embodiment of the present invention. Referring to FIG. 4, a driving line VDD may be disposed along an edge of a substrate, which may be formed of a glass material, and a data line Data, a scan line Scan, and a ground line GND may be disposed therein. A first organic light emitting unit 100, which emits light away from the substrate, and a second organic light emitting unit 200, which emits light toward the substrate, may be disposed on the substrate. In more detail, the first organic light emitting unit 100 includes pixels emitting light away from the substrate, and the second light emitting unit 200 includes pixels emitting light toward the substrate. In another exemplary embodiment of the present invention, the first organic light emitting unit 100 includes pixels emitting light toward the substrate, and the second organic light emitting unit 200 includes pixels emitting light away from the substrate.

Figure 5:
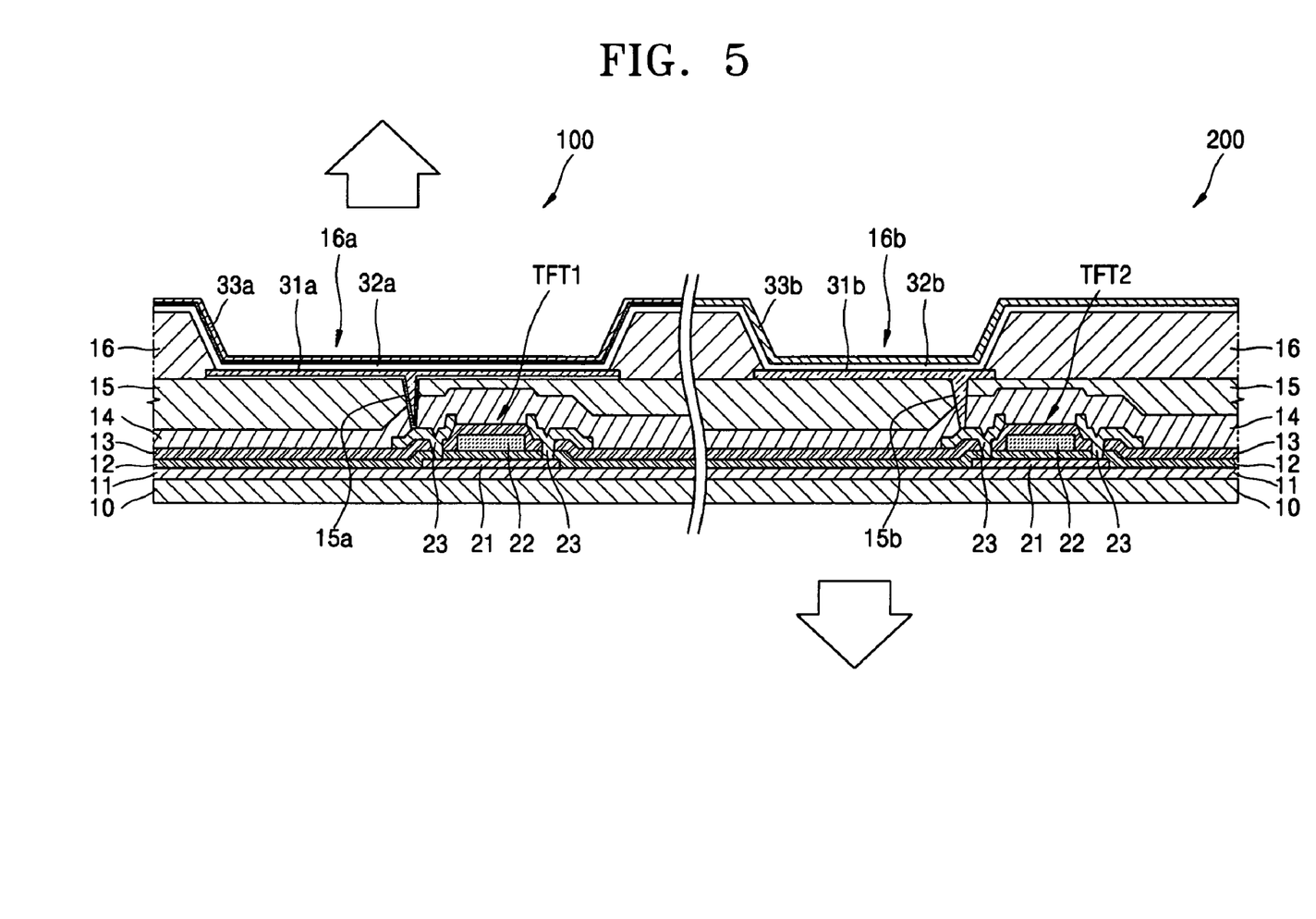
FIG. 5 is a schematic cross-sectional view showing the organic EL display device according to an exemplary embodiment of the present invention.

FIG. 5 is a schematic cross-sectional view showing an organic EL display device according to an exemplary embodiment of the present invention. Referring to FIG. 5, as the arrows indicate, the first organic light emitting unit 100 includes pixels emitting light away from the substrate 10, and the second organic light emitting unit 200 includes pixels emitting light toward the substrate 10. FIG. 5 shows one pixel of the first organic light emitting unit 100 and the second organic light emitting unit 200 for convenience sake. The first organic light emitting unit 100 and the second organic light emitting unit 200 are formed on the same substrate 10, and they may be formed adjacent to each other. A buffer layer 11 may be formed on the substrate 10.

Additionally, a TFT1, which drives an organic light emitting layer 32a of the first organic light emitting unit 100, and a TFT2, which drives an organic light emitting layer 32b of the second organic light emitting unit 200, may be formed on the same substrate 10, and they may be formed by the same process using the same material. That is, a semiconductor active layer 21, a gate insulating layer 12, a gate electrode 22, an interlayer dielectric 13, and source/drain electrodes 23 may be formed by respectively stacking the same material in the same process. Therefore, the TFT1 the TFT2 may have the same structure. Additionally, a passivation layer 14, an over coat layer 15, and via holes 15a and 15b may also be made by the same process.

First electrode layers 31a and 31b may function as anodes, and second electrode layers 33a and 33b may function as cathodes. The polarity of the first electrode layers 31a and 31b and the second electrode layers 33a and 33b may be reversed.

The first organic light emitting unit 100 is a front surface emitting type because it emits light away from the substrate 10. In this case, the first electrode layer 31a, which is disposed under the organic layer 32a, may be a reflective electrode. Therefore, the first electrode layer 31a may comprise a lower reflective metal electrode layer and an upper transparent electrode layer on the lower reflective layer. For example, the first electrode layer 31a may be formed by forming a reflective layer using Ag, Mg, Al, Pt, Pd, Au, Ni, Nd, Ir, Cr, and a compound thereof, and then by forming ITO, IZO, ZnO, or $In_2O_3$ thereon.

Additionally, the second electrode layer 33a of the first organic light emitting unit 100 may be formed as a transmission type electrode. For example, the second electrode layer 33a may comprise a lower layer of a metal having a lower work function than that of the first electrode layer 31a, that is, Li, Ca, LiF/Ca, LiF/Al, Al, Mg, and a compound thereof, and an upper sub-electrode layer or bus electrode line formed with a material for forming transparent electrodes, such as ITO, IZO, ZnO, or $In_2O_3$, on the lower layer.

On the other hand, the second organic light emitting unit 200 is a back surface emitting type that emits light toward the substrate 10. Therefore, the first electrode layer 31b disposed under the organic layer 32b may be a transmission type electrode. Hence, the first electrode layer 31b may be a transparent electrode layer formed of materials such as ITO, IZO, ZnO, or $In_2O_3$.

Further, the second electrode layer 33b disposed on the organic layer 32b may be reflective. Therefore, the second electrode layer 33b may be a metal electrode layer formed by depositing materials such as Li, Ca, LiF/Ca, LiF/Al, Al, Mg, and a compound thereof As described above, the first electrode layers 31a and 31b of the first and second light emitting units 100 and 200 are separately formed. However, the organic layers 32a and 32b, which are formed on a pixel defining layer 16 and on the first electrode layers 31a and 31b, may be formed in a common process. The organic layers 32a and 32b may be divided into an organic light emitting layer and an organic common layer. The organic light emitting layer may be formed in an opening 16a of the first organic light emitting unit 100 and an opening 16b of the second organic light emitting unit 200, and the organic common layer may be formed throughout the substrate 10. Alternatively, the organic light emitting layer and the organic common layer may be formed throughout the entire substrate 10. In this case, the first and second organic light emitting units 100 and 200 may include a hole injection layer, a hole transport layer, an organic layer, an electron transport layer, and an electron injection layer that are formed on the same layer as each other, respectively.

Figure 6:
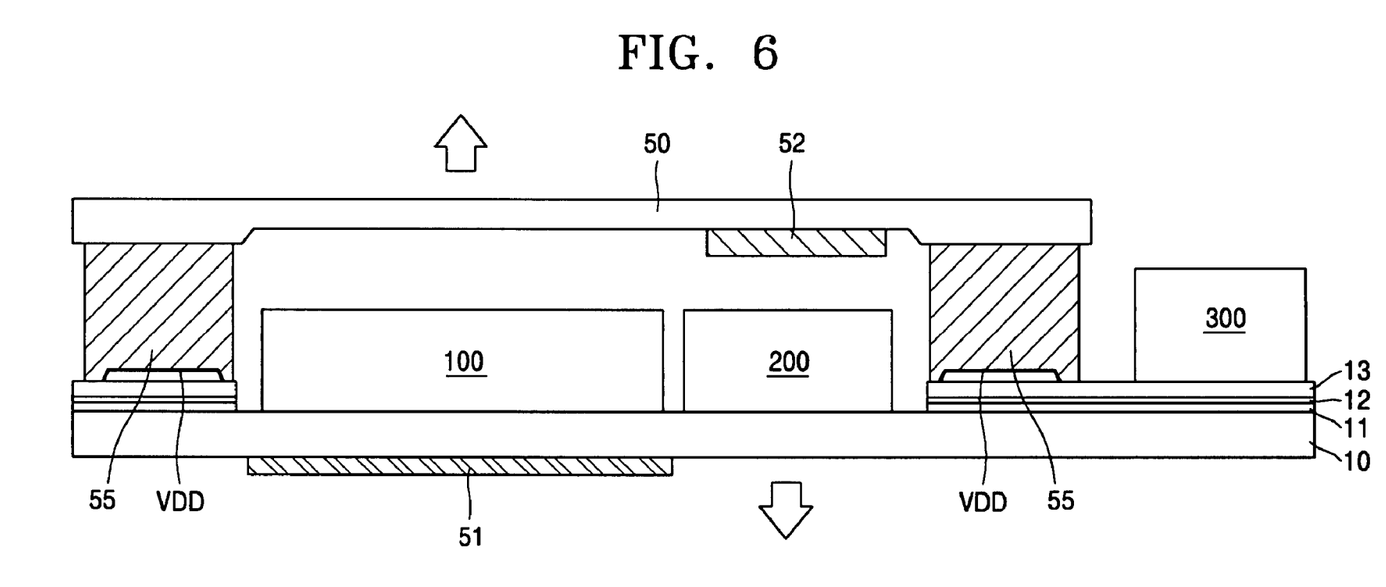
FIG. 6 is a schematic cross-sectional view showing the organic EL display device according to an exemplary embodiment of the present invention.

FIG. 6 is a schematic cross-sectional view showing an organic EL display device according to an exemplary embodiment of the present invention. After mounting the first organic light emitting unit 100 and the second organic light emitting unit 200 on the substrate 10, they may be encapsulated with a sealing member 50 and a side wall 55. In the side wall 55, the driving line VDD may be formed on the interlayer dielectric 13. A driving device 300 may be formed as a chip on glass disposed on the substrate.

A getter 52 may be formed on a second electrode layer 33b of the second organic light emitting unit 200. Referring to FIG. 6, the getter 52 may also be formed on a surface of the sealing member 50 in a region where the second organic light emitting unit 200 is disposed. In FIG. 6, since an upper portion of the second organic light emitting unit 200 may be shielded from view, the getter 52 does not interrupt light emission from the organic layer 32b. Additionally, the getter 52, which absorbs moisture in the organic EL display device, may be easily formed on the upper portion of the second organic light emitting unit 200.

A light reflection member 51 may formed under the substrate 10 on a portion corresponding to the first organic light emitting unit 100. In FIG. 6, since the lower portion of the first organic light emitting unit 100 is a region that may be shielded from view, the light reflection member 51, such as a mirror, does not interrupt light emission from the organic layer 32a. Additionally, the lower portion of the first organic light emitting unit 100 may be a good place to form the light reflection member 51 in a mobile terminal or a personal digital assistant (PDA) using the organic EL display device.

Figure 7A:
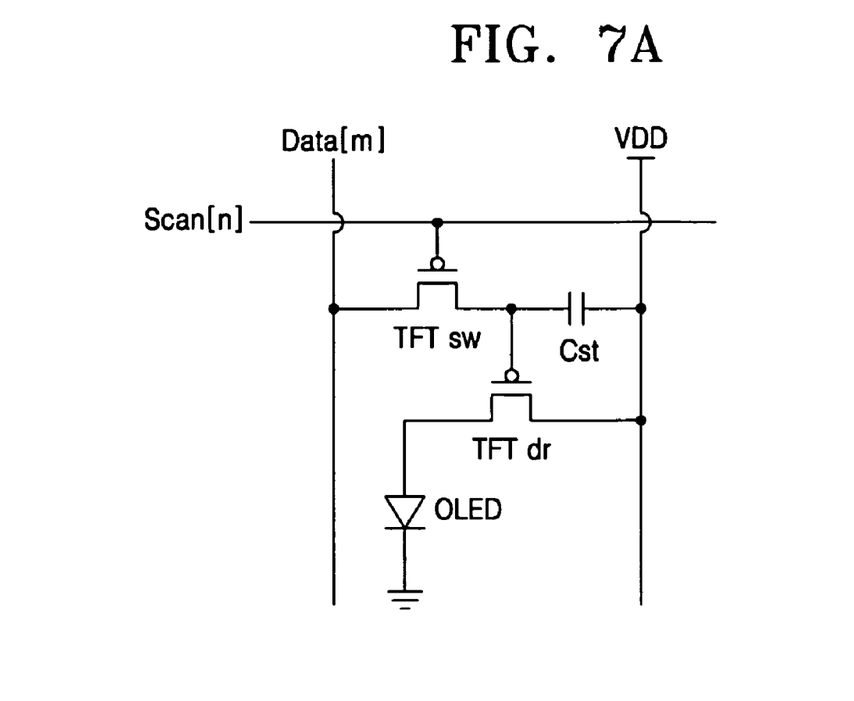
FIG. 7A and FIG. 7B are circuit diagrams showing a pixel in the organic EL display device according to an exemplary embodiment of the present invention.
Figure 7B:
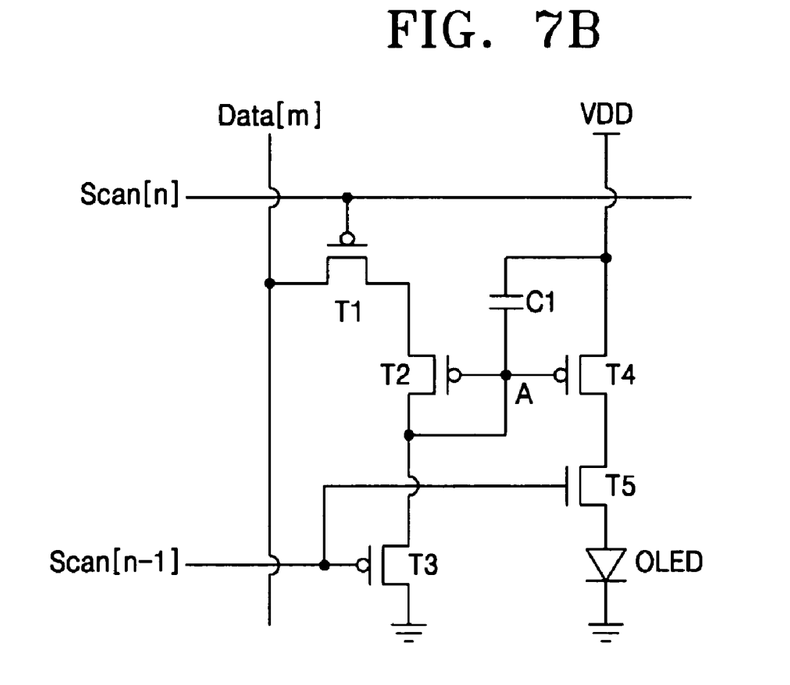

FIG. 7A and FIG. 7B are circuit diagrams showing pixels in the organic EL display device according to exemplary embodiments of the present invention. Referring to FIG. 7A, the scan line Scan, the data line Data, and the power line VDD may surround the pixel, and each pixel may include a switching TFT $TFT_{sw}$, a driving TFT $TFT_{dr}$, a capacitor $C_{st}$, and an organic light emitting device OLED. The switching TFT $TFT_{sw}$ is driven by a scanning signal that is applied to the scan line Scan, and it transmits a data signal that is applied to the data line Data. The driving TFT $TFT_{dr}$ determines the amount of current flowing into the OLED through the driving line VDD according to the data signal (i.e. by a voltage difference Vgs between the driving transistor's gate and source electrodes). The capacitor $C_{st}$ stores the data signal for one frame. However, it may be difficult to display a high gray scale image due to the irregularity of a threshold voltage Vth of the driving TFT $TFT_{dr}$.

Referring to FIG. 7B, the pixel includes the driving TFT T4 and a mirror TFT T2, thus a high gray scale image may be displayed in spite of the driving transistor's irregular threshold voltage Vth. The gate of a first TFT T1 is coupled to the $n^{th}$ scan line Scan[n], and its source is coupled to the $m^{th}$ data line Data[m]. When the first TFT T1 is selected by the selection signal from the scan line Scan[n], the switching operation transmitting the data signal to the drain is performed. A second TFT T2 is a mirror TFT of the driving TFT T4. The source of the second TFT T2 is coupled to the drain of the first TFT T1, its gate and source are coupled to each other to perform as a diode, and a node A may compensate the threshold voltage included in the data signal. The gate of a third TFT T3 is coupled to an $n-1^{th}$ scan line Scan[n-1], (i.e. the previous selection signal line), its source is coupled to the node A, and its drain is grounded to initialize the node A according to a reset signal and a selection signal of the previous selection signal line. The capacitor C1 is coupled between the driving line VDD and the node A to maintain the data signal voltage of the node A for a predetermined period, and the gate of the fourth TFT T4 is coupled to the node A to provide a current, in proportion to the magnitude of the data signal, from the driving line VDD to the OLED. Accordingly, the OLED emits light. The fourth TFT T4 is coupled to the OLED through a fifth TFT T5. To prevent undesired light emission, the fifth TFT T5 blocks the current flowing to the OLED when the signals stored in the capacitor C1 are initialized through the third TFT T3. The fourth TFT T4 may be directly coupled to the OLED. Hence, the fifth TFT T5 may be omitted. In this pixel structure, the first TFT T1 samples the data signal, and the voltage of the capacitor Cl is initialized by the $n-1^{th}$ selection signal. Additionally, the second TFT T2, (i.e. the mirror TFT), performs as a diode, thus compensating for the driving transistor's threshold voltage. The data signal may be stored in the capacitor C1 for 1 frame period to drive the fourth TFT T4, thereby supplying current to the OLED. Therefore, since the threshold voltage Vth of the TFT T4 may be compensated for in the pixel structure of FIG. 7B, high gray scale images may be displayed.

The area occupied by the TFTs in each pixel is larger for the circuit structure shown in FIG. 7B, thus it may not be appropriate to use that circuit for the back surface emitting type organic EL display device. Rather, it may be used in the front surface emitting type device.

In exemplary embodiments of the present invention, the first organic light emitting unit 100 may display bright, high gray scale images, and the second organic light emitting unit 200 may display relatively darker, low gray scale images. Therefore, the first organic light emitting unit 100 may utilize the circuit structure of FIG. 7B for compensating the driving transistors' threshold voltage Vth, and the second organic light emitting unit 200 may utilize the circuit structure shown in FIG. 7A, which does not compensate for the threshold voltage.

The first organic light emitting unit 100 may be a full-color display for displaying various colors, and the second organic light emitting unit 200 may be a mono color type or an area color type displaying different colors from pattern regions. With the full-color display, the pixels may comprise at least two different colors. It is desirable that the first organic light emitting unit 100 has red, green, and blue pixels.

Figure 8:
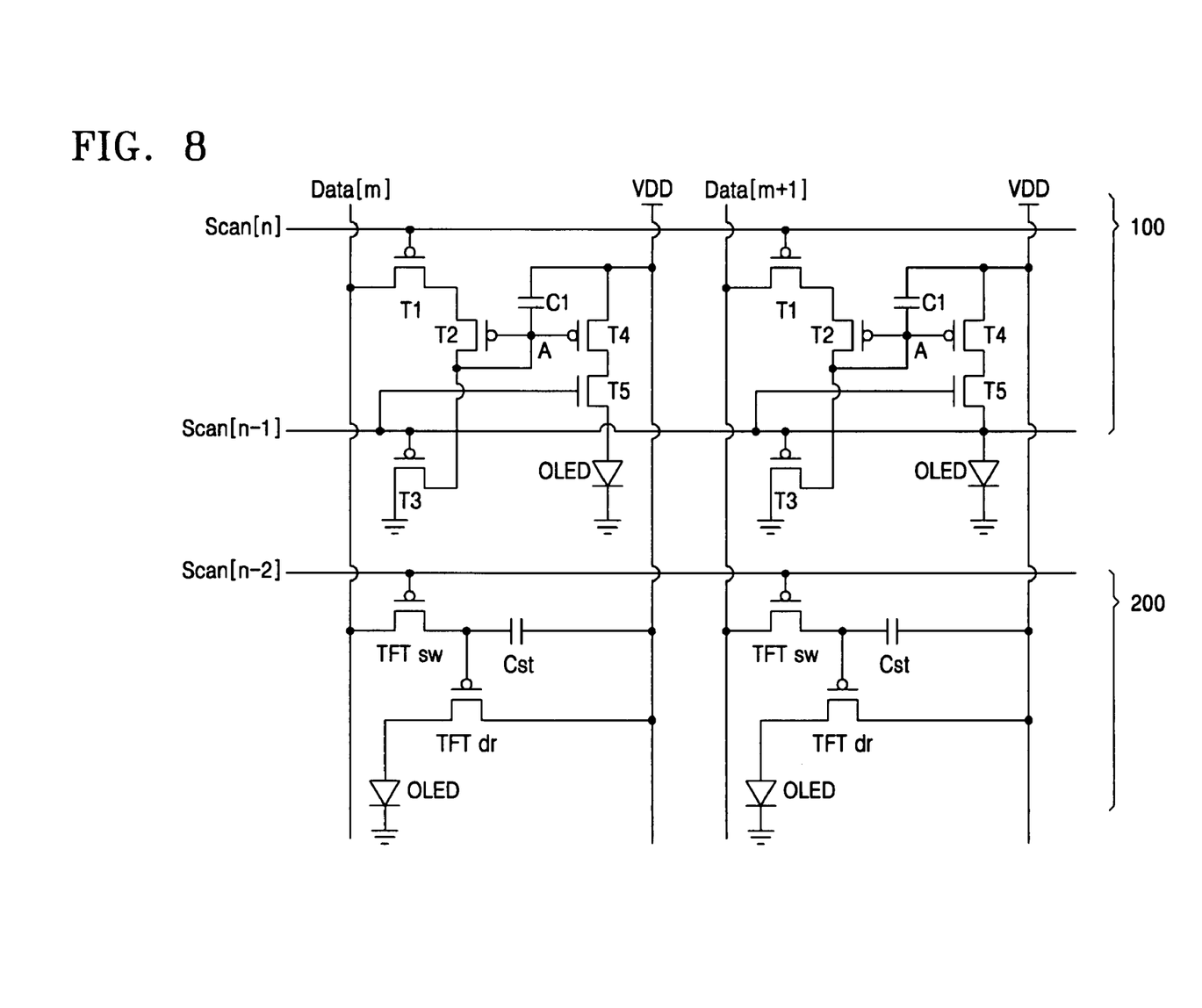
FIG. 8 is a schematic circuit diagram showing organic light emitting units in the organic EL display device according to exemplary embodiments of the present invention.

FIG. 8 is a schematic circuit diagram showing the organic light emitting units of the organic EL display device according to an exemplary embodiment of the present invention.

FIG. 8 shows two pixels of the first organic light emitting unit 100 and two pixels of second organic light emitting unit 200. While two pixels of each unit are shown in FIG. 8, the light emitting units comprise many more pixels.

The first organic light emitting unit 100 includes a switching TFT T1 receiving a data signal that is a signal for a selected pixel, a driving TFT T4 driving the OLED according to the data signal, and a mirror TFT T2 compensating for the threshold voltage of the driving transistor. The second organic light emitting unit 200 includes a switching TFT $TFT_{sw}$ receiving the data signal, and a driving TFT $TFT_{dr}$ driving the pixel according to the data signal, however, it does not include the mirror TFT T2.

The switching TFT T1 of the first organic light emitting unit 100 and the switching TFT TFTsw of the second organic light emitting unit 200 may be coupled to the same data line. For example, FIG. 8 shows them coupled to the same data line Data[m]. Therefore, the data line Data, which is coupled to the first and second organic light emitting units 100 and 200, may be formed simultaneously with the first and second organic light emitting units 100 and 200.

Additionally, the driving TFT T4 of the first organic light emitting unit 100 and the driving TFT $TFT_{dr}$ of the second organic light emitting unit 200 may be coupled to the same driving line VDD. Therefore, the driving line VDD may be formed simultaneously with the first and second organic light emitting units 100 and 200.

The first and second organic light emitting units may be driven in a TDC driving method when displaying high resolution images of 180 PPI or greater.

Additionally, the pixels of the first and second organic light emitting units 100 and 200 may be arranged so that their widths W, their lengths L, and intervals between adjacent pixels P are the same as each other, respectively. In other words, referring to FIG. 4, a width W1 may equal a width W2, a length L1 may equal a length L2, and an interval P1 between pixels of the first organic light emitting unit 100 may equal an interval P2 between pixels of the second organic light emitting unit 200. When the pixels are so arranged, the data line Data and the driving line VDD may be coupled to the pixels of the first organic light emitting unit 100 and the pixels of the second organic light emitting unit 200.

Further, the first organic light emitting unit 100 and the second organic light emitting unit 200 may operate exclusively. For example, the first organic light emitting unit 100 may serve as a mobile terminal's inner window, and the second organic light emitting unit 200 may serve as the mobile terminal's external window. In this case, the second organic light emitting unit 200 may operate when the mobile terminal is folded, and the first organic light emitting unit 100 may operate when the mobile terminal is unfolded.

According to exemplary embodiments of the present invention, organic light emitting units that emit light in different directions may be disposed on the same plane as each other, thus enabling a thin and light-weight display device.

Additionally, TFTs for both light emitting units may be fabricated simultaneously in the same structure and the same process, thereby reducing the organic EL display device's fabrication costs.

Further, the light emitting units may be driven by the same data line and the same driving line in the same driving device. Thus, costs for forming the driving device may be reduced.

The getter may be formed on a rear portion of the organic light emitting unit that emits light toward the substrate. Thus, the getter, which protects the devices from moisture, may be easily formed.

The first and second organic light emitting units may be formed of dual-emitting type organic EL devices. In this case, the light reflection member or the getter may be respectively installed on a surface and the other surface of the substrate, on which the first organic light emitting unit is formed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence (EL) display device, comprising:
   a substrate;
   a first organic light emitting unit and a second organic light emitting unit formed on the substrate, the first organic light emitting unit comprising a plurality of pixels to emit light in a first direction only and the second organic light emitting unit comprising a plurality of pixels to emit light in a second direction only,
   wherein the first organic light emitting unit and the second organic light emitting unit emit light in different directions, and
   wherein the first organic light emitting unit and the second organic light emitting unit include a reflective electrode at each pixel.

2. The display device of claim 1,
   wherein the first organic light emitting unit emits light away from the substrate, and wherein the second organic light emitting unit emits light toward the substrate.

3. The display device of claim 2,
   wherein the first organic light emitting unit and the second organic light emitting unit include a thin film transistor at each pixel, and
   wherein the thin film transistor of the first organic light emitting unit and the thin film transistor of the second organic light emitting unit are formed on a same layer as each other.

4. The display device of claim 3, wherein the thin film transistor of the first organic light emitting unit and the thin film transistor of the second organic light emitting unit comprise:
   a semiconductor active layer;
   a gate electrode formed in an area corresponding to a channel region of the semiconductor active layer; and a source electrode and a drain electrode coupled to a source region and a drain region, respectively, of the semiconductor active layer.

5. The display device of claim 2,
wherein the first organic light emitting unit and the second organic light emitting unit include a switching thin film transistor that transmits a data signal, and p1 wherein the switching thin film transistor of the first organic light emitting unit and the switching thin film transistor of the second organic light emitting unit are coupled to a common data line.

6. The display device of claim 2,
wherein the first organic light emitting unit and the second organic light emitting unit include a driving thin film transistor that drives an organic electroluminescence device, and
wherein the driving thin film transistor of the first organic light emitting unit and the driving thin film transistor of the second organic light emitting unit are coupled to a common driving line.

7. The display device of claim 2, wherein each pixel of the first organic light emitting unit comprises:
a first electrode layer;
an organic layer on the first electrode layer; and
a second electrode layer on the organic layer,
wherein the first electrode layer is the reflective electrode, and
wherein the second electrode layer is a transmission type.

8. The display device of claim 7, wherein the first electrode layer comprises a transparent electrode layer formed on a metal electrode layer.

9. The display device of claim 7, wherein the second electrode layer comprises a transparent electrode layer formed on a metal electrode layer.

10. The display device of claim 2, wherein each pixel of the second organic light emitting unit comprises:
a first electrode layer;
an organic layer formed on the first electrode layer; and
a second electrode layer formed on the organic layer,
wherein the first electrode layer is a transmission type, and wherein the second electrode layer is the reflective electrode.

11. The display device of claim 10, wherein the first electrode layer includes a transparent electrode layer.

12. The display device of claim 10, wherein the second electrode layer includes a metal electrode layer.

13. The display device of claim 1, wherein the first organic light emitting unit and the second organic light emitting unit operate exclusively.

14. The display device of claim 1, further comprising a getter in a region corresponding to the second organic light emitting unit.

15. The display device of claim 1, further comprising a light reflection member formed on an opposite side of the substrate as the first organic light emitting unit.

16. An organic electroluminescence (EL) display device, comprising:
a substrate;
a first organic light emitting unit disposed in a first region of the substrate and comprising a plurality of pixels, and a second organic light emitting unit disposed in a second region of the substrate and comprising a plurality of pixels,
wherein the first organic light emitting unit displays a first image in a first direction away from the substrate,
wherein the second organic light emitting unit displays a second image in a second direction towards the substrate, and the pixels of the first organic light emitting unit are not separated from each other by the pixels of the second organic light emitting unit,
wherein the first organic light emitting unit and the second organic light emitting unit include a thin film transistor at each pixel, and
wherein the thin film transistor of the first organic light emitting unit and the thin film transistor of the second organic light emitting unit are formed on a same layer as each other.

17. The display device of claim 16,
wherein a source of the thin film transistor of the first organic light emitting unit is coupled to a line, and
wherein a source of the thin film transistor of the second organic light emitting unit is coupled to the line.

18. An organic electroluminescence (EL) display device, comprising:
a substrate;
a plurality of first pixels to emit light away from the substrate, the plurality of first pixels being arranged in a first area on the substrate;
a plurality of second pixels to emit light toward the substrate, the plurality of second pixels being arranged in a second area on the substrate, the second area being spaced apart from the first area,
wherein a first pixel and a second pixel each comprise a switching transistor and a driving transistor.

19. The display device of claim 18 wherein the switching transistor of the first pixel and the switching transistor of the second pixel are connected to different scan lines than each other, and the driving transistor of the first pixel and the driving transistor of the second pixel are connected to the same data line as each other.

* * * * *

UNITED STATES PATENT AND TRADEMARK OFFICE
CERTIFICATE OF CORRECTION

PATENT NO. : 7,586,254 B2 Page 1 of 1
APPLICATION NO. : 11/132349
DATED : September 8, 2009
INVENTOR(S) : Kwak et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1147 days.

Signed and Sealed this

Fourteenth Day of September, 2010

David J. Kappos
*Director of the United States Patent and Trademark Office*